United States Patent [19]

Liu

[11] Patent Number: 5,246,818
[45] Date of Patent: Sep. 21, 1993

[54] DEVELOPER COMPOSITION FOR POSITIVE WORKING COLOR PROOFING FILMS

[75] Inventor: Shuchen Liu, Clinton, N.J.

[73] Assignee: Hoechst Celanese Corporation, Somerville, N.J.

[21] Appl. No.: 394,697

[22] Filed: Aug. 16, 1989

[51] Int. Cl.$^5$ .................. G03F 7/32; G03F 7/023; G03C 1/795

[52] U.S. Cl. .................. 430/326; 430/143; 430/165; 430/166; 430/191; 430/192; 430/193; 430/331; 430/909; 430/910

[58] Field of Search .............. 430/331, 166, 191, 193, 430/326, 192, 909, 910, 143

[56] References Cited

U.S. PATENT DOCUMENTS

| | | | |
|---|---|---|---|
| 4,374,920 | 2/1983 | Wanat | 430/331 |
| 4,436,807 | 3/1984 | Walls | 430/309 |
| 4,467,027 | 8/1984 | Yamamoto et al. | 430/165 |
| 4,592,992 | 6/1986 | Hsieh et al. | 430/331 |
| 4,692,397 | 9/1987 | Liu | 430/325 |
| 4,772,533 | 9/1988 | Platzer et al. | 430/165 |
| 4,780,396 | 10/1988 | Hsieh et al. | 430/331 |
| 4,873,174 | 10/1989 | Dhillon et al. | 430/331 |

FOREIGN PATENT DOCUMENTS 1035189  7/1978  Canada.

OTHER PUBLICATIONS

Chemical Abstracts 104:216409.
Chemical Abstracts 104:13089.
Chemical Abstracts 104:15127.
Chemical Abstracts 97:64123.
Chemical Abstracts 92:31978.
Chemical Abstracts 90:178122.
Chemical Abstracts 86:113714.

*Primary Examiner*—Charles L. Bowers, Jr.
*Assistant Examiner*—John S. Chu
*Attorney, Agent, or Firm*—Andrew F. Sayko, Jr.

[57] ABSTRACT

A developer composition for positive color proofing films containing
a) sodium, potassium or ammonium octyl sulfate; sodium, potassium or ammonium lauryl sulfate; sodium decyl sulfate; or sodium tetradecyl sulfate; and
b) sodium or potassium borate; and
c) boric acid; and
d) monobasic sodium or potassium phosphate; and
e) sodium or potassium citrate; and
f) sodium or potassium salicylate; and
g) sodium, potassium or lithium benzoate; and
h) sufficient water to formulate an effective developer.

6 Claims, No Drawings

DEVELOPER COMPOSITION FOR POSITIVE WORKING COLOR PROOFING FILMS

BACKGROUND OF THE INVENTION

The present invention relates to developer compositions for photographic elements comprising photosensitive coatings on substrates, or more particularly to developer compositions for removing the non-image areas of exposed, usually positive working color proofing films. In the art of lithographic printing, it is desirable to produce a color proof to assist a printer in correcting a set of photomasks which will be used in exposing printing plates. The proof should reproduce the color quality that will be obtained during the printing process. The proof must be a consistent duplicate of the desired halftone or line image, and should neither gain nor lose color. Visual examination of a color proof should reveal any defects on the photomask, the best color rendition to be expected from press printing of the material; the correct gradation of all colors; and whether there is a need for changing any of the colors and/or for altering the film photomask before making printing plates.

Color proofing films are generally composed of a transparent substrate, which may or may not have been treated for release, slip or adhesive properties. The transparent substrate is then be applied with a photosensitive coating comprising a photosensitizer, binding resins, colorants, acid stabilizers, surfactants and other art recognized components. Common photosensitizers include o-quinone diazides, diazonium condensates salts and photopolymerizable compositions.

There are several types of photographic color proofing films known in the art, namely, the surprint, overlay, and transfer types. In the overlay type of color proofing, an independent transparent plastic support is used for producing an image of each color separation film. A number of such supports carrying colored images are then superimposed upon each other and placed on a white sheet to produce a color proof. The overlay type of color proof has the disadvantage that the superimposed plastic supports tend to darken the color proofing sheet, and, as a result, the impression of the color proofing sheet thus prepared becomes vastly different from copies actually obtained by a conventional printing press proof. Its primary advantage is that it is quick and can serve as a progressive proof by combining any two or more colors in register.

In the surprint type of color proofing method, a color proofing sheet is prepared by successively producing images of different colors from different color separation films onto a single receptor sheet. This is done by utilizing a single opaque support and by applying toners, photosensitive solutions or coatings of photosensitive materials of corresponding colors on the opaque support in succession. An example of this approach is described in U.S. Pat. No. 3,671,236. An advantage of the surprint type of color proof is that the color saturation is not influenced by superimposed plastic supports. This method more closely resembles the actual printing and eliminates the color distortion inherent in the overlay system.

U.S. Pat. Nos. 4,260,673 and 4,093,464 describe positive working one-piece proofing systems based on orthoquinone diazides. In U.S. Pat. No. 4,093,464 a colored image is transferred to a receiver sheet after exposure and development. U.S. Pat. No. 4,260,673 describes transfer of a solid color layer to a receiver sheet prior to exposure and development. U.S. Pat. No. 4,659,642 teaches a positive working color proofing system which has a transparent substrate, a colored photosensitive layer on the substrate, and a top adhesive layer.

It is known in the art to prepare developing compositions for lithographic elements. Developer compositions remove the non-image portion of the plate after it has been imagewise exposed. The developer should also prevent removed non-image particles of the photosensitive surface from being re-deposited back onto the film. In the past, various methods of developing lithographic elements have been employed. Such methods include the use of compositions containing organic solvents, surfactants, salts, acids and other art recognized materials in solution. Typical prior art developing compositions are described in U.S. Pat. Nos. 2,754,279; 4,381,340 and German OLS No. 2,216,419.

It is most desirable to have a developer composition which is capable of completing development in a short period of time. The proper selection of the developer solution is very important. It is most desirable to produce a developer which is an aqueous solution of salts and surfactants in the absence of organic solvents since organic solvents are expensive and ecologically disadvantaneous to dispose of after use. If the developer solution is a good solvent of the light sensitive composition itself, the solvent will satisfactorily distinguish between the exposed areas and the unexposed areas, and the image area coating is not dissolved, swollen or removed, otherwise such films will have no practical value. However, it has been found that during the development of color proofing films, particularly in positive working films, there is a tendency for the exposed non-image coating areas not to be completely removed. This results in an undesirable background stain which distorts the image. Nonimage areas especially those comprising resin binders such as acetals may not fully dissolve out. A balance of developer properties is necessary where adequate speed of development is attained, there is essentially no redeposit of particles, and background stain. It is also desired that the developer be useful in processing machinery where it can be used over again. As such it is important that the developing power not significantly change from one proofing sheet to the next, and certaining not change from the front of the sheet to the rear of the sheet.

It is an object of this invention to provide a developer for both machine and hand development of color proofing films having resin binders in their photosensitive coatings, which will enable the operator to prepare a film free from redeposit and background stain, and having good development speed. These and other objects will become apparent in the detailed description of the preferred embodiment.

SUMMARY OF THE INVENTION

The invention provides a developer composition for photographic elements which comprises in admixture:
  a) from about 0.3% to about 8.0% by weight of the composition of one or more compounds selected from the group consisting of sodium, potassium or ammonium octyl sulfate; sodium, potassium or ammonium lauryl sulfate; sodium decyl sulfate; and sodium tetradecyl sulfate; and
  b) from about 1.0% to about 7.0% by weight of the composition of one or more components selected from the group consisting of sodium and potassium borate; and c) from about 0.2% to about 5.5% by weight of the composition of boric acid; and d) from about 0.5% to about 6.0% by weight of the composition of one or more compounds selected from the group consisting of monobasic sodium, or potassium phosphate; and e) from about 1.0% to about 10.0% by weight of the composition of one or more components selected from the group consisting of sodium and potassium citrate; and f) from about 1.0% to about 10.0% by weight of the composition of one or more components selected from the group consisting of sodium and potassium salicylate; and g) from about 0.1% to about 5.0% by weight of the composition of one or more compounds selected from the group consisting of sodium, potassium and lithium benzoate; and h) sufficient water to formulate an effective developer.

The invention further provides a method of producing an image which comprises coating a substrate with a positive working photographic composition, which composition comprises a naphthoquinone diazide, and an aqueous alkaline soluble binder resin; imagewise exposing said coated composition to sufficient actinic radiation to form a latent image thereon, and then removing the non-exposed portions thereof with a developer composition comprising the foregoing admixture.

DETAILED DESCRIPTION OF THE PREFERRED EMBODIMENT

In carrying out the method of the invention, one employs a photographic element which broadly comprises a substrate having a release surface, a colored photosensitive layer on the release surface and an adhesive layer on the photosensitive layer. Optional additional layers containing anti-halation materials, adhesion promoters or release agents may also be used.

In the preferred embodiment, the substrate is composed of a dimensionally and chemically stable base material which does not significantly change its size, shape, or chemical properties as the result of the heating, coating or other treatments which it must undergo. One preferred material is polyethylene terephthalate. In the usual case it has a thickness of from about 1 to about 10 mils, a more preferred thickness is from about 2-5 mils and most preferably from about 2-3 mils. Suitable films include Hostaphan 3000, available from Hoechst Celanese Corporation, Mylar D, available from DuPont and Melinex grades 0; 052; 442; 516 and S, available from ICI. The surface of the substrate may be smooth or may be provided with a matte texture by various methods known in the art. The substrate must have a release surface, that is, it must be capable of releasably holding the photosensitive layer thereto. This may be accomplished either by the substrate surface being inherently releasable, being rendered releasable by a suitable treatment or being provided with a release layer over the substrate surface. Such a release layer may comprise polyvinyl alcohol.

Releasably bonded to the release surface is the photosensitive layer. The photosensitive layer broadly comprises a photosensitizer, colorants, binding resins, and other optional ingredients such as plasticizers, acid stabilizers, surfactants, antistatic compositions, uv absorbers and residual coating solvents.

The preferred photosensitizer is a light sensitive, naphthoquinone diazide. The most preferred photosensitizer is the ester of bis-(3-benzoyl-4,5,6 trihydroxy phenyl)-methane and 2-diazo-1-naphthol-5-sulfonic acid as taught in the U.S. Pat. No. 4,407,926. Other suitable photosensitizers are taught in the U.S. Pat. No. 4,266,001, 3,106,365, 3,148,983 and 3,201,239. The diazo compounds of choice are preferably soluble in organic solvents.

The nature and amount of the binder resins must be such that the overall photosensitive composition produces a layer whose non-image areas are removed by the developer while the image areas are not so removed. Resins non-exclusively include polyvinyl butyrals, polyvinyl propionals, and styrene maleic anhydride half esters. Suitable binding resins are preferably aqueous alkaline soluble, and water insoluble. Such include the novolaks and polyvinyl phenols. In the most preferred embodiment the binding resin has the general formula

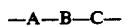

wherein a plurality of each of components A, B and C occur in ordered or random sequence in the resin and wherein A is present in said resin at about 5% to about 20% by weight and comprises groups of the formula

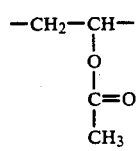

B is present in said resin at about 4% to about 30% by weight and comprises groups of the formula

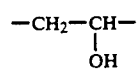

and C is present in said resin at about 50% to about 91% by weight and comprises acetal groups consisting of groups of the formulae

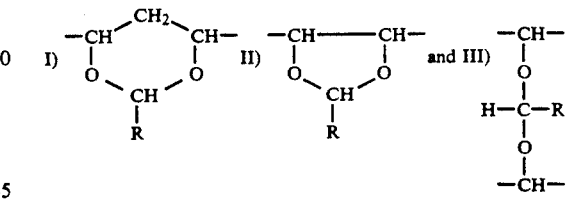

where R is lower alkyl or hydrogen, and wherein said group I. is present in component C from about 75% to about 85%; group II. is present in component C from about 3% to about 5%; and group III. is present in component C from about 10% to about 22%. All of said acetal members are based on the mol number of acetal units in component C. An important resin selection criterion is that it must be a good film former. These resins are more fully described in U.S. Pat. No. 4,665,124 which is incorporated herein by reference.

The colorants useful for the present invention include various classes of dyes and pigments. In the most preferred embodiment, pigments having an average particle size diameter of about 1 micrometer or less are used.

These ingredients may be blended with such compatible solvents as gamma butyrolactone, diacetone alcohol, propylene glycol monomethyl ether, ethanol, methyl cellosolve and methyl ethyl ketone, coated on the release surface, and dried.

In the preferred embodiment, the colorant is present in the photosensitive layer in an amount of from about 10 to about 40 percent by weight; or more preferably from about 13 to about 34 percent by weight.

In the preferred embodiment, the photosensitizer is present in the photosensitive layer in an amount of from about 15 to about 60 percent by weight; or more preferably from about 20 to about 50 percent by weight.

In the preferred embodiment, the binding resin is present in the photosensitive layer in an amount of from about 20 to about 75 parts by weight; or more preferably from about 30 to about 70 parts by weight.

In the preferred embodiment an optional the plasticizer is used and is present in the photosensitive layer in an amount of up to about 20 parts by weight; or more preferably up to about 15 parts by weight and most preferably from about 12 to about 15 parts by weight.

Typical formulations for the photosensitive layer include:

|  | Yellow | Magenta | Cyan | Black |
|---|---|---|---|---|
| propylene glycol monomethyl ether | 57.00 | 50.40 | 33.72 | 43.44 |
| methyl ethyl ketone | 9.37 | 10.72 | 34.22 | 25.20 |
| gamma-butyrolactone | 19.35 | 22.53 | 16.96 | 15.33 |
| diacetone alcohol | 9.72 | 11.12 | 9.40 | 11.09 |
| polyvinyl acetal/alcohol/acetate resin as above | 0.82 | 0.88 | 1.04 | 0.73 |
| Butvar B-90 | 0.36 | 0.41 | 0.45 | 0.42 |
| Scripset 550 | 1.20 | 1.19 | 1.20 | — |
| Scripset 540 | — | — | — | 1.41 |
| Above diazo from U.S. Pat. No. 4,407,926 | 1.50 | 1.87 | 1.78 | 1.49 |
| phthalo blue pigment | — | 0.01 | 1.23 | — |
| yellow pigment | 0.68 | 0.02 | — | — |
| magenta pigment | — | 0.85 | — | — |
| black pigment | — | — | — | 0.89 |

The adhesive layer comprises polyvinyl acetate and may optionally contain such other desired components as uv absorbers, optical brighteners, anti-static compositions and plasticizers. Useful polyvinyl acetates nonexclusively include Mowilith DM-6, 20, DM-22, 25, 30 and mixtures thereof, available from Hoechst AG. These are usually dispersed in water, or dissolved in methyl isobutyl ketone or n-butyl acetate or other solvent compositions for coating on the photosensitive layer. It is then dried to a coating weight of from about 5 to about 30g/m$^2$, more preferably from about 10 to about 20g/m$^2$. The layer may optionally contain a uv absorber such as Uvinul D-50 from G.A.F. It may also contain a polymeric plasticizer such as Resoflex R-296, a polyester plasticizer available from Cambridge Industries or Carboset 525 available from BF Goodrich. It may also contain antistats, such as Gafac and Gafstat from G.A.F. It may also contain other resins, such as Nitrocellulose RS ½, available from Hercules. It may also contain an optical brightener such as Uvitex OB from Ciba Geigy. The adhesive layer should not be tacky to the touch, during storage or during development of the photosensitive element. The layer should have a softening point in the range of from about 60° C. to about 180° C., preferably 60° C. to 120° C., more preferably 60° C. to 100° C. In the preferred embodiment, the polyvinyl acetate is present in the adhesive layer in an amount of greater than about 50 percent by weight. The plasticizer may be present in an amount of up to about 30 percent by weight, the uv absorber up to about 20 percent by weight, the optical brightener up to 1.0 percent by weight, and other resins up to about 50 percent by weight.

Typical adhesive formulations include:

| I. | Water | 50.00 |
|---|---|---|
|  | Mowilith DM-22 | 50.00 |
| II. | i-butyl acetate | 78.00 |
|  | Resoflex | 1.00 |
|  | Mowilith 30 | 21.00 |
| III. | i-butyl acetate | 79.90 |
|  | Uvitex OB | 0.10 |
|  | Mowilith 30 | 20.00 |

In operation, the photosensitive element is laminated to a receptor sheet via the adhesive layer. The receiver sheet should be resistant to any adverse effects which may be caused by the developer of choice. For example, the receiver sheet should be water resistant if aqueous developers are used. Plastic or plastic-coated receiver sheets are useful for this purpose.

Useful receiver sheets include Melinex 329; 339; 994 and 3020 from ICI. Other white and nonwhite receiver sheets may also be used. Rough textured and/or adhesion promoted surfaces are preferred for the receiver, which must be able to withstand the laminating and development processes.

Lamination may be conducted by putting the receiver sheet in contact with the adhesive side of the colored composite and then introducing the two materials into the nip of a pair of heated laminating rollers under suitable pressure. Suitable laminating temperatures usually range from about 60° C. to about 90° C., preferably about 75 C. to about 85° C. After lamination, the substrate is peeled away, usually merely employing manual peeling forces. The adhesive and photosensitive layers thus remain on the receiver sheet.

The photosensitive layer is imagewise exposed by means well known in the art either before or after lamination. Such exposure may be conducted by exposure to a uv light source through a photomask under vacuum frame conditions. Exposure may be performed with actinic light through a conventional positive flat. Exposures after lamination and peel apart are preferred for emulsion-to-emulsion contact. Mercury vapor discharge lamps are preferred over metal halide lamps. Filters may be used to reduce light scattering in the material.

After lamination, peel apart and exposure, the photosensitive layer is developed by dissolving the exposed area in the developer of this invention. The process can then be repeated whereby another photosensitive element having a different color is laminated to the same receiver sheet over the previously formed image. In the usual case, four colored layers are employed to produce a full color reproduction of a desired image. These are cyan, magenta, yellow and black. The above photographic element is described in more detail in U.S. Pat. No. 4,659,642 which is incorporated herein by reference. The present invention provides a method for developing and finishing such exposed photosensitive elements by contacting them, to remove the non-image areas, using a developer which contains the aforementioned ingredients in an aqueous mixture. The mixture preferably has a pH which is in the range of from about 7.9 to about 9.0, more preferably from about 8.6 to about 8.85.

The developer contains a sulfate surfactant component which is selected from the group consisting of sodium, potassium or ammonium octyl sulfate; sodium, potassium or ammonium lauryl sulfate; sodium decyl sulfate; and sodium tetradecyl sulfate; and is present in a preferred range of from about 0.3% to about 8.0% by weight of the developer. A more preferred range is from about 0.6% to about 3.5% and most preferably from about 0.8% to about 2.0%.

The developer also contains from about 1.0% to about 7.0% by weight of the developer of one or more of sodium and potassium borate. A more preferred range is from about 2.0% to about 6.0% and most preferably from about 3.5% to about 4.5%.

The developer also contains from about 0.2% to about 5.5% by weight of the developer of boric acid. A more preferred range is from about 0.3% to about 2.5% and most preferably from about 0.5% to about 1.5%.

The developer also contains from about 0.5% to about 6.0% by weight of the developer of one or more compounds selected from the group consisting of monobasic sodium and potassium phosphate. A more preferred range is from about 0.7% to about 3.5% and most preferably from about 1.5% to about 2.5%.

The developer also contains from about 1.0% to about 10.0% by weight of the developer of one or more of sodium and potassium citrate. A more preferred range is from about 3.0% to about 8.0% and most preferably from about 4.0% to about 6.0%.

The developer further contains from about 1.0% to about 10.0% by weight of the developer of one or more compounds selected from the group consisting of sodium and potassium salicylate. A more preferred range is from about 2.0% to about 8.0% and most preferably from about 3.0% to about 5.0%.

The developer also contains from about 0.1% to about 5.0% by weight of the developer of one or more of sodium, lithium and potassium benzoate. A more preferred range is from about 0.3% to about 1.5% and most preferably from about 0.4% to about 0.6%.

In the preferred embodiment, the developer of the present invention preferably contains optional minor amounts of a conventional anti-foam component which aids in processing of the printing plate. This component, when it is used is preferably present in an amount of from about 0.02% to about 0.05% by weight of the developer. One preferred anti-foam agent is Dow DB-31 which is a silicone type anti-foam. The developer then contains sufficient water to formulate an effective developer. The developer is capable of substantially completely removing the non-image areas of a photographic element in about 2 minutes or less while simultaneously removing substantially none of the image areas. Substantially none of the material comprising said non-image areas is re-deposited back onto the photographic element.

The following non-limiting examples serve to illustrate the invention.

EXAMPLE 1

A series of color proofing films is prepared according to the example in U.S. Pat. No. 4,659,642. They are imagewise exposed to actinic radiation as described therein in a manner well known to the skilled artisan. The thusly exposed film is then processed with the following developer composition:

| Ingredients | Weight Percent |
| --- | --- |
| Sodium octyl sulfate | 1.2 |
| Potassium borate | 4.0 |
| Boric acid | 0.8 |
| Potassium Phosphate Monobasic | 2.0 |
| Sodium citrate | 5.0 |
| Sodium salicylate | 4.0 |
| Sodium benzoate | 0.5 |
| Soft water | balance |

After lamination, peel apart and exposure, the film develops cleanly without noticeable background staining or re-deposit of removed coatings.

EXAMPLE 2

Example 2 is repeated except development is conducted with the following formulation:

| Ingredients | Weight Percent |
| --- | --- |
| Sodium octyl sulfate | 3.0 |
| Potassium borate | 1.0 |
| Boric acid | 0.8 |
| Potassium Phosphate Monobasic | 0.8 |
| Sodium citrate | 5.0 |
| Sodium salicylate | 4.0 |
| Sodium benzoate | 0.5 |
| Soft water | balance | pH = 8.37

After lamination, peel apart and exposure, the film develops cleanly without noticeable background staining or re-deposit of removed coatings.

EXAMPLE 3

Example 1 is repeated except development is conducted with the following formulation:

| Ingredients | Weight Percent |
| --- | --- |
| Sodium octyl sulfate | 1.0 |
| Potassium borate | 3.0 |
| Boric acid | 1.3 |
| Potassium Phosphate Monobasic | 2.0 |
| Sodium citrate | 4.0 |
| Sodium salicylate | 3.0 |
| Sodium benzoate | 0.5 |
| Soft water | balance | pH = 8.15

After lamination, peel apart and exposure, the film develops cleanly without noticeable background staining or re-deposit of removed coatings.

EXAMPLE 4

As a comparative Example 1 is repeated except development is conducted with the following formulation which does not contain the citrate component:

| Ingredients | Weight Percent |
| --- | --- |
| Sodium octyl sulfate | 1.2 |
| Potassium borate | 1.0 |
| Boric acid | 0.8 |
| Potassium Phosphate Monobasic | 0.8 |
| Sodium salicylate | 4.0 |
| Sodium benzoate | 0.5 |

| Ingredients | Weight Percent |
| --- | --- |
| Soft water | balance | pH = 8.23

After lamination, peel apart and exposure, the film develops only slowly.

EXAMPLE 5

As a comparative Example 1 is repeated except development is conducted with the following formulation which does not contain the salicylate component:

| Ingredients | Weight Percent |
| --- | --- |
| Sodium octyl sulfate | 1.2 |
| Potassium borate | 4.0 |
| Boric acid | 1.0 |
| Potassium Phosphate Monobasic | 2.0 |
| Sodium citrate | 3.0 |
| Sodium benzoate | 3.0 |
| Soft water | balance | pH = 8.18

After lamination, peel apart and exposure, the film develops only slowly.

EXAMPLE 6

Example 1 is repeated except development is conducted with the following formulation:

| Ingredients | Weight Percent |
| --- | --- |
| Sodium octyl sulfate | 1.2 |
| Potassium borate | 4.0 |
| Boric acid | 1.0 |
| Potassium Phosphate Monobasic | 2.0 |
| Sodium citrate | 3.0 |
| Sodium salicylate | 2.0 |
| Sodium benzoate | 0.5 |
| Soft water | balance | pH = 8.52

After lamination, peel apart and exposure, the film develops cleanly without noticeable background staining or re-deposit of removed coatings.

EXAMPLE 7

Example 1 is repeated except development is conducted with the following formulation:

| Ingredients | Weight Percent |
| --- | --- |
| Sodium octyl sulfate | 1.1 |
| Potassium borate | 3.5 |
| Boric acid | 1.2 |
| Potassium Phosphate Monobasic | 2.0 |
| Sodium citrate | 4.5 |
| Sodium salicylate | 3.5 |
| Sodium benzoate | 0.4 |
| Soft water | balance | pH = 8.56

After lamination, peel apart and exposure, the film develops cleanly without noticeable background staining or re-deposit of removed coatings.

EXAMPLE 8

Example 1 is repeated except development is conducted with the following formulation:

| Ingredients | Weight Percent |
| --- | --- |
| Sodium octyl sulfate | 1.2 |
| Potassium borate | 2.0 |
| Boric acid | 0.6 |
| Potassium Phosphate Monobasic | 1.5 |
| Sodium citrate | 5.0 |
| Sodium salicylate | 2.0 |
| Sodium benzoate | 0.5 |
| Soft water | balance | pH = 8.27

After lamination, peel apart and exposure, the film develops cleanly without noticeable background staining or re-deposit of removed coatings.

EXAMPLE 9

Example 1 is repeated except development is conducted with the following formulation:

| Ingredients | Weight Percent |
| --- | --- |
| Sodium octyl sulfate | 2.0 |
| Potassium borate | 1.0 |
| Boric acid | 0.8 |
| Potassium Phosphate Monobasic | 1.0 |
| Sodium citrate | 5.0 |
| Sodium salicylate | 4.0 |
| Sodium benzoate | 0.5 |
| Soft water | balance | pH = 7.9

After lamination, peel apart and exposure, the film develops cleanly without noticeable background staining or re-deposit of removed coatings.

EXAMPLE 10

As a comparative Example 1 is repeated except development is conducted with the following formulation which does not contain the boric acid component:

| Ingredients | Weight Percent |
| --- | --- |
| Sodium octyl sulfate | 2.0 |
| Potassium borate | 0.8 |
| Potassium Phosphate Monobasic | 0.4 |
| Sodium citrate | 4.0 |
| Sodium salicylate | 8.0 |
| Sodium benzoate | 0.5 |
| Soft water | balance | pH = 9.55

After lamination, peel apart and exposure, removed particles of the coating redeposit back onto the film and undesired background staining is observed.

What is claimed is:

1. A method of producing an image which comprises coating a substrate with a positive working photographic composition, which composition comprises a naphthoquinone diazide, and an aqueous alkaline soluble binder resin; imagewise exposing said coated composition to sufficient actinic radiation to form a latent image thereon, and then removing the non-exposed, portions thereof with a developer composition having a pH of from about 7.9 to about 9.0 consisting essentially of in admixture:

a) from about 0.3% to about 8.0% by weight of the composition of one or more compounds selected from the group consisting of sodium, potassium or ammonium octyl sulfate; sodium, potassium or ammonium lauryl sulfate; sodium decyl sulfate; and sodium tetradecyl sulfate; and b) from about 1.0% to about 7.0% by weight of the composition of one or more components selected from the group consisting of sodium, and potassium borate; and c) from about 0.2% to about 5.5% by weight of the composition of boric acid; and d) from about 0.5% to about 6.0% by weight of the composition of one or more compounds selected from the group consisting of monobasic sodium, or potassium phosphate; and e) from about 1.0% to about 10.0% by weight of the composition of one or more components selected from the group consisting of sodium and potassium citrate; and f) from about 1.0% to about 10.0% by weight of the composition of one or more components selected from the group consisting of sodium and potassium salicylate; and g) from about 0.1% to about 5.0% by weight of the composition of one or more compounds selected from the group consisting of sodium, potassium and lithium benzoate; and h) sufficient water to formulate an effective developer.

2. The method of claim 1 wherein component (a) is present in an amount of from about 0.8% to about 2.0%, and component (b) is present in an amount of from about 3.5% to about 4.5%, and component (c) is present in an amount of from about 0.5% to about 1.5% and component (d) is present in an amount of from about 1.5% to about 2.5%, and component (e) is present in an amount of from about 4.0% to about 6.0%, and component (f) is present in an amount of from about 3.0% to about 5.0% and component (g) is present in an amount of from about 0.4% to about 0.6% and component, wherein said amounts are based on the weight of the composition.

3. The method of claim 1 wherein component (a) is sodium octyl sulfate and present an amount of from 0.8% about 2.0%, and component (b) is potassium borate and is present in an amount of from about 3.5% to about 4.5%, and component (c) is present in an amount of from about 0.5% to about 1.5% and component (d) is potassium phosphate and is present in an amount of from about 1.5% to about 2.5%, and component (e) is sodium citrate and is present in an amount of from about 4.0% to about 6.0%, and component (f) is sodium salicylate and is present in an amount of from about 3.0% to about 5.0% and component (g) is sodium benzoate and is present in an amount of from about 0.4% to about 0.6% and component, wherein said amounts are based on the weight of the composition.

4. The method of claim 1 wherein said substrate comprises polyethylene terepthalate.

5. The method of claim 1 wherein said photosensitive composition comprises the ester of bis-(3-benzoyl-4,5,6-trihydroxyphenyl)-methane and 2-diazo-1-naphthol-5-sulfonic acid.

6. The method of claim 1 wherein said photosensitive layer further comprises one or more ingredients selected from the group consisting of colorants, plasticizers, antistatic compositions, uv absorbers and surfactants.

* * * * *